INVENTORS
SAMMY A. BUTLER
RICHARD J. SAHULKA
HANNON S. YOURKE
BY Joe L. Koerber
ATTORNEY United States Patent Office 3,209,168
Patented Sept. 28, 1965

3,209,168

TWO STATE OSCILLATOR WITH DURATION OF UNSTABLE STATE DETERMINED BY A CONDITIONABLE ISOLATED TIME DELAY CIRCUIT

Sammy A. Butler, Champaign, Ill., and Richard J. Sahulka and Hannon S. Yourke, Peekskill, N.Y., assignors to International Business Machines Corporation, New York, N.Y., a corporation of New York Filed June 28, 1962, Ser. No. 205,986
32 Claims. (Cl. 307—88.5)

Figure 1A:
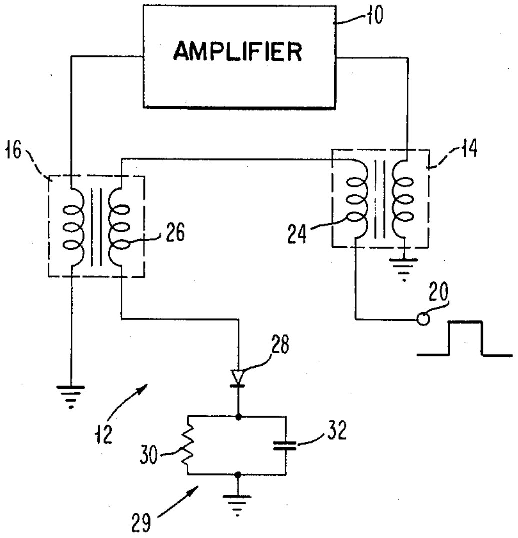

This invention relates to a transistorized single shot circuit and more particularly to such a circuit that provides a relatively long and accurately timed output pulse.

The primary novel feature of this invention is a circuit configuration wherein the oscillations of a circuit are controlled by a dynamically changing impedance in the feedback loop rather than by reaching a specified direct current (D.C.) voltage level of bias in the oscillator amplifier.

A specific embodiment of the invention is in the form of a blocking oscillator. Generators of the blocking oscillator type are known which are capable of producing pulse type signals. It is known to provide capacitors, or resistors, or resistor-capacitor networks, to control the recurrence or repetition rate of the pulses. It also is known in such blocking oscillators to provide transformer coupling of two electrodes of a transistor for regenerative feedback.

One of the primary problems in the design of a transistor single shot or pulse stretcher is to minimize the effects that transistor leakage and/or base currents have on the timing portion of the circuit. Such circuits usually consist of a large signal amplifier including one or more transistors. Many single shots used in present day equipment include four to six transistors to obtain precise delays.

An amplifier may be statically in one of two states, either full on or full off. An input pulse causes the circuit to asume one state and it remains in that state for a period of time determined by a reactive network, usually a simple resistance-capacitance (RC) network. The reactive network is generally included as a part of the D.C. circuit of the amplifier and the timing of the network is affected by transistor leakage and/or base currents.

The circuits may be regenerative or not as desired. The advantages of regenerative methods are that the rise and fall times are enhanced and transistor threshold potentials, that is, potentials at which the circuit changes states, are better defined. Regenerative methods, howeever, generally compound the problems associated with leakage and/or base currents.

In the present invention the timing network is isolated from the D.C. circuit of the amplifier during the cut-off period, thereby eliminating the effects of leakage and/or base currents on the timing network and making possible accurate timing utilizing small value components.

The basic principle of the present invention is as follows: an amplifier is constructed which is biased in the active region, that is, neither off nor saturated. An alternating current (A.C.) regenerative feedback loop is constructed which causes the amplifier to oscillate, preferably in a relaxation mode, when the transfer ratio of the feedback loop is adequate. Included in the feedback loop is a timing network and a variable impedance device. The variable impedance device may be conductive, reactive, or both, but should exhibit an abrupt change in dynamic or small signal impedance in a well defined region of bias.

The variable impedance device largely determines the transfer ratio of the feedback loop, whereas, the state of the timing circuit determines the bias on the variable impedance device. The circuit therefore will be in a state of oscillation or non-oscillation, depending upon the state of the timing circuit.

Accordingly, it is a primary object of this invention to provide an improved single shot circuit.

Another object of this invention is to provide an improved circuit for generating a relatively long output pulse in response to a relatively short input pulse.

A further object of this invention is to provide a circuit wherein the effects of leakage currents on the timing circuit are minimized.

Another object of this invention is to provide an improved single shot circuit having a duration determining reactive network isolated from the D.C. portion of the amplifier circuit by a variable impedance device.

Yet another object of this invention is to provide an improved single shot circuit including an oscillator.

Another object of this invention is to provide an improved single shot circuit for producing relatively long duration pulses using relatively small valued components.

A still further object of this invention is to provide an improved single shot circuit having time duration determining RC circuit isolated from the D.C. portion of the amplifier circuit.

Another object of this invention is to provide a circuit having a time duration reactive network isolated from the D.C. portion of the amplifier circuit by a diode of high energy gap material.

The foregoing and other objects, features and advantages of the invention will be apparent from the following more particular description of a preferred embodiment of the invention, as illustrated in the accompanying drawings.

In the drawings:

FIGURE 1*a* is a general circuit configuration.

Figure 1B:
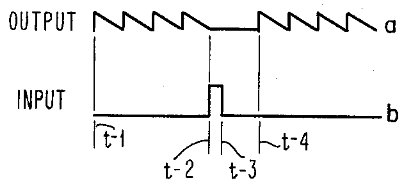

FIGURE 1*b* shows input and output waveforms for the circuit of FIGURE 1*a*.

Figure 2A:
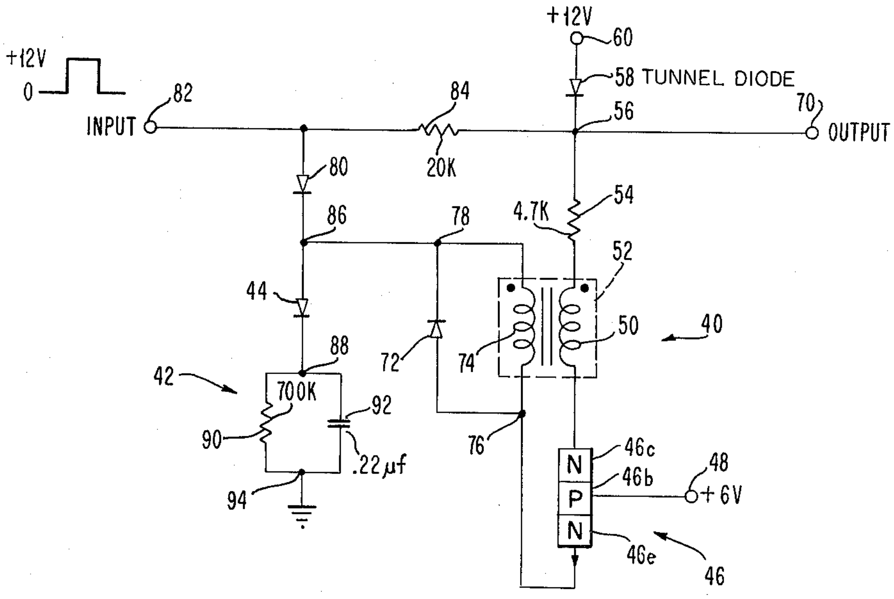

FIGURE 2*a* is a specific circuit configuration.

Figure 2B:
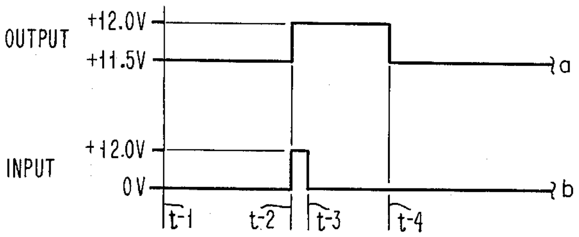

FIGURE 2*b* shows input and output waveforms for the circuit of FIGURE 2*a*.

Figure 3:
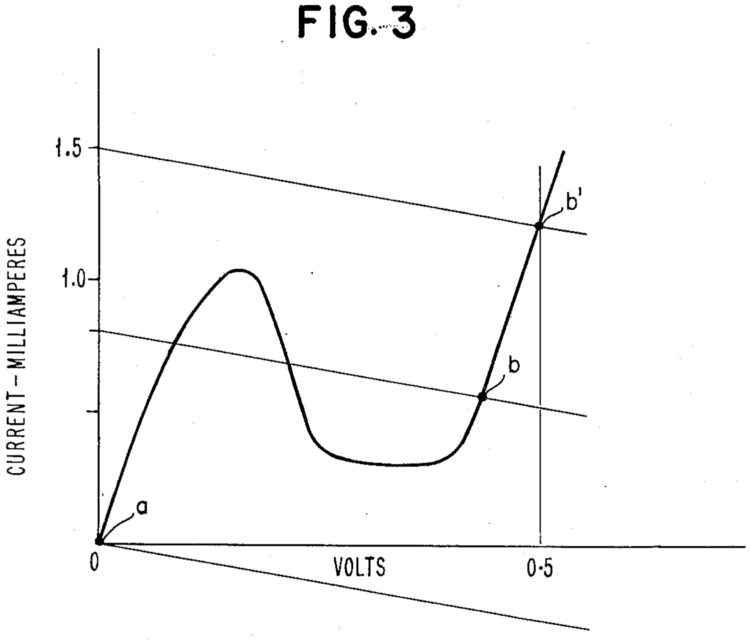

FIGURE 3 shows the current-voltage curve and load lines of a tunnel diode.

Referring to FIGURE 1*a*, a basic circuit configuration is illustrated. The circuit consists of an amplifier 10 which is A.C. coupled to a timing portion 12 of the circuit by transformers 14 and 16, thus assuring complete isolation of the timing portion from leakage currents of the amplifier. The isolation by transformers is not essential, but makes the inventive feature more apparent. The transformer coupling provides regenerative feedback whereby the circuit oscillates as indicated on line *a* of FIG. 1*b*.

An input terminal 20 is connected through series connected transformer windings 24 and 26, through a high impedance device, such as a high energy gap diode 28, and through a parallel RC network 29 to ground. The RC network includes a resistor 30 and a capacitor 32. The diode 28 may be composed, for example, of silicon or gallium arsenside. A silicon diode, for example, has extremely low leakage currents in the order of .005 micro-ampere at 6 volt reverse bias.

At time *t*–1, FIG. 1*b*, the circuit 10 is oscillating due to the regenerative feedback coupling. When a positive input pulse is applied to terminal 20 at time *t*–2, the capacitor 32 is charged to a positive value. Upon termination of the input pulse, the diode 28 is back biased, being connected on one side to the positively charged capacitor 32 and on the other side, through windings 24 and 26, to ground, whereby the oscillations cease, as indicated at time *t*–2 on line *a* in FIG. 1*b*.

Upon termination of the input pulse, time *t*–3, the charge on the capacitor 32 commences leaking off through resistor 30 to ground. Due to the high impedance of the diode 28 at this time, very little current flows therethrough and, for practical purposes, the capacitor may be considered as discharging solely through the resistor 30. As the charge leaks off, a level is reached where the diode 28 enters a region of high susceptance, enabling oscillations to commence.

With the RC network 29 thus isolated, the discharge time is determined by the time required for the charge on the capacitor 32 to leak off through the resistor 30. Therefore the time constant is independent of the D.C. portion of the amplifier circuit and can be accurately calculated. Since the charge leaks off only through the resistor, the capacitor value may be small relative to that normally required for known circuits performing a similar function.

A more complete understanding of the principle of this invention may be had by reference to the detailed description of the specific circuit configuration shown in FIGURE 2*a*. This circuit includes a blocking oscillator generally designated 40, an RC circuit generally designated 42, and a diode 44 composed of high energy gap material, for example, silicon or gallium arsenide.

The circuit 40 comprises an NPN transistor 46 having a collector **46*c*, a base 46*b*, and an emitter 46*e* which is connected in a common base configuration. The base 46*b* is connected to a +6 volt supply represented by a terminal 48. The collector 46*c* is connected through one winding 50 of a transformer 52, a 4.7K ohm resistor 54, a junction 56, and a tunnel diode 58 to a +12 volt supply represented by a terminal 60. The tunnel diode may have a 1 milliampere rating with a 0.5 volt drop thereacross in the high voltage state. An output terminal 70 is connected to the junction 56. The purpose of the tunnel diode 58 is to produce a voltage rise at the output terminal 70** which defines the off or non-oscillating period of the circuit as indicated between times *t*–2 and *t*–4 in FIGURE 2*b*.

A diode 72, which may be, for example, of the germanium type, and the second winding 74 of the transformer 52 are connected in parallel between junctions 76 and 78. The purpose of the diode 72 is to prevent ringing oscillations. The junction 76 is connected to the emitter **46*e* of the transistor. The junction 78 is connected, through a diode 80 which may be of the germanium type, to an input terminal 82**.

The transformer windings 50 and 74 are connected, as indicated by the dots adjacent the windings in FIGURE 2*a*, so that a positive feedback signal is supplied to the transistor. It should be noted that the secondary winding 74 could be inserted in the transistor base circuit just as well as in the emitter circuit.

The input terminal 82 is connected through a 20K ohm resistor 84 to the junction point 56. One side of the diode 44 is connected to a junction 86 between the junction 78 and the diode 80. The opposite side of the diode 44 is connected to one junction 88 of parallel connected resistor 90 and capacitor 92 which form the RC network 42. The opposite junction 94 is connected to ground. In a specific circuit configuration, the resistor 90 may be 700K ohms and the capacitor 92 may be .22 microfarad.

*Operation*

At time *t*–1, FIGURE 2*b*, the input voltage at terminal 82 is at the 0 volt level; the circuit 40 is oscillating (in the ON state); the tunnel diode 58 is in its high voltage state varying between points *b* and *b'* in FIGURE 3; and the output terminal 70, due to the 0.5 volt drop across the tunnel diode, is at approximately +11.5 volts.

At time *t*–2, when the input signal level at termnial 82 changes from 0 to +12 volts, the biasing current that flows through the resistor 84 and diode 58 is reduced to 0 since the voltage thereacross is reduced to 0. Therefore, the diode 58 switches to its low voltage state, point *a* in FIGURE 3, at the termination of the last cycle of oscillation, raising the output terminal 70 to the +12 volt level. With the +12 volt level applied to terminal 82, the diodes 80 and 44 are forward biased and the capacitor 92 is charged up to nearly +12 volts. The transistor is back biased and oscillation ceases. This charging of the capacitor 92 may be considered as conditioning of the RC network 42 to inhibit oscillations.

After the +12 volt input level has been removed from the terminal 82, at time *t*–3, the diodes 80 and 44 are back biased. The transistor is forward biased and conducts the leakage current of diode 80 minus the leakage current of diode 44. The transistor can be well in its conducting region as long as the shunt dynamic impedance of 80 and 44 is sufficiently high to prevent oscillations from occurring. This non-oscillating state following removal of the +12 volt signal is considered to be the OFF state.

The capacitor 92 starts to discharge through the resistor 90. The diode 44, being back biased during this discharge time, prevents the transistor leakage and/or base currents from flowing in the timing circuit 42. Thus, the discharge time of capacitor 92 is independent of these currents. The diode 44 also presents a sufficiently high dynamic impedance to prevent a build-up of oscillation conditions.

Because the diode 44 is of high energy gap material, its reverse current is small compared to the current that flows through the resistor 90. This allows an accurate RC time constant to be obtained using a relatively high value for resistor 90 and a relatively low value for capacitor 92. For example, using a commercially available silicon diode 44, and assuming a temperature variation resulting in 1000% variation in diode leakage current, the effects of leakage current on the timing of the circuit is limited to plus or minus 0.5%, using resistor values up to two megohms.

When the capacitor 92 has discharged below the +6 volt level, that is, slightly below the transistor base voltage, the diode 44 enters a region of high susceptance wherein regeneration may commence. This change of susceptance is due to the change in the dynamic impedance of the diode 44 as the voltage on one side drops below the +6 volt level. As the impedance of the diode 44 drops, the circuit becomes regenerative. This regenerative action is not due to the increased transistor current but rather is a function of the impedance of the diode 44.

As regeneration occurs, the circuit commences oscillating, forcing large pulses of current down through the tunnel diode 58. These current pulses are limited by the resistor 54 to less than 1.5 milliamperes. However, the pulses exceed 1 milliampere (see FIGURE 3) and, as a consequence, switch the tunnel diode 58 back to its high voltage state, time *t*–4 in FIGURE 2*b*, terminating the output pulse by returning the output terminal 70 to the +11.5 volt level. Thereafter, as long as the input terminal 82 remains at the 0 volt level, these current pulses occur just often enough to maintain the charge on the capacitor 92 near the +6 volt level.

The specific circuit configuration of FIGURE 2*a* produces output pulses of 100 milliseconds or more in response to input pulses of less than one millisecond duration using a small 0.22 microfarad capacitor rather than a very large one as is required in known circuits performing a similar function.

Although the circuit has been described as normally oscillating and being switched to a non-oscillating state, it will be apparent to those skilled in the art that without departing from the scope of the invention, a circuit could be made which is normally in a non-oscillating state and is switched to an oscillating state.

While the invention has been particularly shown and described with reference to a preferred embodiment thereof, it will be understood by those skilled in the art that various changes in form and details may be made therein without departing from the spirit and scope of the invention.

What is claimed is:

1. A device comprising, in combination, a circuit having an oscillating state and a non-oscillating state,
input means for receiving an input signal and operative in response to said input signal to switch said circuit from one said state to the other said state,
timing circuit means operative in response to said input signal for determining the time duration of said other state,
and means isolating said timing circuit means from the remainder of said circuit during said time duration.

2. The invention of claim 1 wherein said timing circuit means comprises a reactive network.

3. The invention of claim 1 wherein said isolating means comprises a variable impedance device.

4. The invention of claim 1 wherein said isolating means comprises a silicon diode.

5. The invention of claim 1 wherein said isolating means comprises a gallium arsenide diode.

6. The device of claim 1 wherein said isolating means comprises a high energy gap diode.

7. A device comprising, in combination, a circuit normally operating in an oscillating state,
input means for receiving an input signal and operative in response to said input signal to switch said circuit from said oscillating state, to a non-oscillating state,
timing circuit means operative in response to said input signal for determining the time duration of said non-oscillating state,
and means isolating said timing circuit means from the remainder of said circuit during said time duration.

8. The invention of claim 7 wherein said timing circuit means comprises a reactive network.

9. The invention of claim 7 wherein said isolating means comprises a variable impedance device.

10. The invention of claim 7 wherein said isolating means comprises a silicon diode.

11. The invention of claim 7 wherein said isolating means comprises a gallium arsenide diode.

12. The device of claim 7 wherein said isolating means comprises a high energy gap diode.

13. A device comprising, in combination,
an oscillator circuit including a transistor having its terminal circuits connected in an oscillator configuration and biased to a normally oscillating state,
a conditionable time delay circuit connected in said oscillator circuit and operable, when conditioned, to inhibit ocillations of said oscillator circuit for a predetermined time, after which time, said oscillations resume independently of further conditioning of the time delay circuit;
means for applying a signal to said device to bias said oscillator circuit to a non-oscillating state and to condition said time delay circuit, and
isolating means included in said oscillator circuit and operative during said predetermined time to isolate said time delay circuit from the remainder of said oscillator circuit.

14. The device of claim 13 wherein said time delay circuit comprises a reactive network.

15. The device of claim 13 wherein said isolating means comprises a uni-directional conductivity device.

16. The device of claim 13 wherein said isolating means comprises a high energy gap diode.

17. The device of claim 13 wherein said isolating means comprises a silicon diode.

18. The device of claim 13 wherein said isolating means comprises a gallium arsenide diode.

19. The device of claim 13 including a transformer coupling two of said terminal circuits to provide a regenerative feedback to cause said oscillator circuit normally to oscillate.

20. The device of claim 13 wherein said isolating means includes a diode, and said conditionable time delay circuit includes a resistor and a capacitor connected in parallel,
said capacitor being charged through said means for applying a signal, to back bias said diode and inhibit oscillation of said oscillator circuit for the duration of said time delay, while the charge leaks off said capacitor through said resistor.

21. A device comprising, in combination,
an oscillator including a transistor having its emitter, collector and base circuits connected in an oscillator configuration and biased to a normally oscillating state,
a conditionable time delay circuit connected in series with said emitter circuit and operable, when conditioned, to inhibit oscillations of said oscillator for a predetermined time, after which time, said oscillations resume independently of further conditioning of the time delay circuit,
means for applying a signal to said device to bias said oscillator to a non-oscillating state and to condition said time delay circuit, and
isolating means connected in series with said time delay circuit and operative during said predetermined time to isolate said time delay circuit from the remainder of said device.

22. The device of claim 21 wherein said time delay circuit comprises a reactive network.

23. The device of claim 21 wherein said isolating means comprises a uni-directional conductivity device.

24. The device of claim 21 wherein said isolating means comprises a high energy gap diode.

25. The device of claim 21 wherein said isolating means comprises a silicon diode.

26. The device of claim 21 wherein said isolating means comprises a gallium arsenide diode.

27. The device of claim 21 including a transformer coupling two of the three circuits, comprising the emitter, collector and base circuits, to provide a feedback path to cause said oscillator normally to oscillate.

28. The device of claim 21 including a transformer coupling said emitter and collector circuits to provide a feedback path to cause said oscillator normally to oscillate.

29. The device of claim 21 wherein said isolating means includes a diode and said conditionable time delay circuit includes a resistor and a capacitor connected in parallel,
said capacitor being charged through said means for applying a signal, to back bias said diode and inhibit oscillation of said oscillator for the duration of said time delay, while the charge leaks off said capacitor through said resistor.

30. The device of claim 21 wherein a tunnel diode is connected in circuit with said collector circuit and said input means for differentiating said oscillating and non-oscillating states.

31. A device comprising, in combination,
an oscillator circuit including a transistor having its terminal circuits connected in an oscillator configuration and biased to a conducting state, with a transformer coupling two of said terminal circuits to provide a regenerative feedback, whereby said oscillator circuit normally oscillates,
a conditionable time delay circuit comprising a resistor and a capacitor connected in parallel and operable, when in a conditioned state, to maintain said oscillator circuit in a non-oscillating state,
said time delay circuit being conditionable by charging said capacitor to a conditioned level, and the length of said time delay being determined by the time required for said capacitor to discharge to a level below said conditioned level, conditioning means for applying a signal to said device to bias said oscillator circuit to a non-oscillating state and to charge said capacitor to said conditioned level, and a high energy gap diode connected in series between said time delay circuit and the remainder of said oscillator circuit and effective in said conditioned state to isolate said time delay circuit, whereby said capacitor discharges through said resistor.

32. A device comprising, in combination, an oscillator including a transistor having its emitter, collector and base circuits connected in an oscillator configuration and biased to a conducting state, with a transformer coupling two of the three circuits comprising the emitter, collector and base circuits, to provide a regenerative feedback, whereby said oscillator normally oscillates;

a conditionable time delay circuit connected in series with said emitter circuit and operable, when in a conditioned state to maintain said oscillator in a non-oscillating state, said time delay circuit comprising a resistor and a capacitor connected in parallel, said time delay circuit being conditionable by charging said capacitor to a conditioned level, and the length of said time delay being determined by the time required for said capacitor to discharge to a level below said conditioned level, conditioning means for applying a signal to said device to bias said oscillator to a non-oscillating state and to charge said capacitor to said conditioned level, and a high energy gap diode connected in series between said time delay circuit and the remainder of the device and effective in said conditioned state to isolate said time delay circuit, whereby said capacitor discharges through said resistor.

References Cited by the Examiner

UNITED STATES PATENTS 2,676,251 4/54 Scarbrough ------------ 331—149

OTHER REFERENCES

IBM Technical Disclosure Bulletin, vol. 3, No. 9, February 1961, "Self Biasing Oscillator," C. E. Dorrell.

ARTHUR GAUSS, *Primary Examiner.*